(12) United States Patent
Chui et al.

(10) Patent No.: US 10,209,275 B2
(45) Date of Patent: Feb. 19, 2019

(54) DETACHABLE PROBE CARD INTERFACE

(71) Applicant: Corad Technology Inc., Santa Clara, CA (US)

(72) Inventors: Ka Ng Chui, Menlo Park, CA (US); Chongliang Ding, Shannxi (CN); Xing Yubing, Henan (CN); Xu Guochun, Beijing (CN)

(73) Assignee: CORAD TECHNOLOGY INC., Santa Clara, CA (US)

( * ) Notice: Subject to any disclaimer, the term of this patent is extended or adjusted under 35 U.S.C. 154(b) by 0 days.

(21) Appl. No.: 15/633,736

(22) Filed: Jun. 26, 2017

(65) Prior Publication Data

US 2018/0372778 A1 Dec. 27, 2018

(51) Int. Cl.
*G01R 31/00* (2006.01)
*G01R 1/073* (2006.01)
*G01R 31/28* (2006.01)

(52) U.S. Cl.
CPC ..... *G01R 1/07378* (2013.01); *G01R 1/07342* (2013.01); *G01R 31/2886* (2013.01)

(58) Field of Classification Search
CPC .................................................. G01R 1/07378
See application file for complete search history.

(56) References Cited

U.S. PATENT DOCUMENTS

| | | | | |
|---|---|---|---|---|
| 6,246,247 B1* | 6/2001 | Eldridge | .............. | B23K 20/004 |
| | | | | 257/E21.503 |
| 6,524,115 B1* | 2/2003 | Gates | .................. | G01R 1/0408 |
| | | | | 439/66 |
| 2007/0159200 A1* | 7/2007 | Kimura | .............. | G01R 31/2808 |
| | | | | 324/755.08 |

* cited by examiner

*Primary Examiner* — Clayton E. LaBalle
*Assistant Examiner* — Jas A Sanghera
(74) *Attorney, Agent, or Firm* — Paradice and Li LLP

(57) ABSTRACT

A detachable probe card interface comprises a space transformer, a deformable connector, and a carrier board. The space transformer includes first electrical contacts and second electrical contacts, wherein the first electrical contacts are coupled to the second electrical contacts through one or more layers of the space transformer. The deformable connector includes a plurality of conductive particles arranged in columns coinciding with the second electrical contacts, wherein the conductive particles compress with one another when one or more forces are exerted on the deformable connector. The carrier board includes a plurality of vias aligned with the plurality of second electrical contacts on the space transformer, and a plurality of conductors disposed within the vias. Each of the conductors is coupled to a respective one of the second electrical contacts and protrudes into the deformable connector to establish a transmission path between the second electrical contact and one or more columns of the conductive particles.

20 Claims, 3 Drawing Sheets

DETACHABLE PROBE CARD INTERFACE

TECHNICAL FIELD

The present invention relates generally integrated circuit technology and specifically to probe cards used to test integrated circuit devices.

BACKGROUND OF RELATED ART

Probe cards are typically used in the testing of integrated circuit (IC) devices. Due to their design, probe cards are particularly advantageous for testing entire semiconductor wafers to detect any manufacturing defects before they are diced and packaged. For example, a probe card is typically formed from a printed circuit board (PCB) having a number of electrical contact elements and/or traces disposed thereon to connect to a testing apparatus. The PCB is connected to a probe head having a number of pins that are brought into contact with a device under test (DUT) to facilitate the transmission of electrical signals to and from the DUT. Accordingly, the probe card acts as an interface between the testing apparatus and the DUT.

Because the probe head serves as the primary interface with the DUT, the pitch (i.e., spacing between the pins) of the probe head must be very small in order to properly align with corresponding contact pads of the DUT. On the other hand, the electrical traces on the PCB are generally coarser and spaced further apart to be more easily connected to the testing apparatus (e.g., automatic test equipment or "ATE"). Accordingly, many probe cards include a space transformer disposed between the PCB and the probe head to interface the pins of the probe head with the electrical traces on the PCB. A space transformer may be made of a multi-layer structure (such as a multi-layer organic (MLO), multi-layer ceramic (MLC), or multiple layers of substrate) having a plurality of transmission paths formed therein to connect the probe head to the PCB. The transmission paths of the space transformer are typically soldered to pads corresponding to the electrical traces on the PCB. This ensures a stable and/or secure electrical connection between the space transformer and the PCB. However, the soldering also makes it difficult to take apart the probe card should the space transformer need to be replaced.

The stress from repeated testing may cause one or more components of the probe card to break or malfunction, and therefore need to be replaced. Accordingly, there is a need for a probe card assembly with interchangeable components. More specifically, there is a need for a low cost means of detaching (and attaching) the individual components that does not require desoldering (or soldering) of the electrical contacts (e.g., which can be an expensive and time-consuming process).

BRIEF DESCRIPTION OF THE DRAWINGS

The present embodiments are illustrated by way of example and not intended to be limited by the figures of the accompanying drawings.

Like reference numerals refer to corresponding parts throughout the drawing figures.

DETAILED DESCRIPTION

A detachable probe card assembly is disclosed. In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements may be shown as buses or as single signal lines. Each of the buses may alternatively be a single signal line, and each of the single signal lines may alternatively be a bus. The terms, "electrical contacts," "contact elements," and "electrical traces" may be used herein interchangeably. Accordingly, the present invention is not to be construed as limited to specific examples described herein but rather includes within its scope all embodiments defined by the appended claims.

Aspects of the present disclosure provide a probe card interface, including a space transformer, that can be attached to (and detached from) a circuit board in a "solderless" manner (e.g., without soldering the probe card interface to the circuit board). In some embodiments, the probe card interface includes a deformable connector to electrically couple the space transformer to the circuit board. The deformable connector may include an elastic shield and a plurality of conductive particles disposed within the elastic shield. For example, the elastic shield may deform when one or more forces are applied between the space transformer and the circuit board. Moreover, the conductive particles may be configured to compress with one another to form electrical connections between electrical contacts on the space transformer and corresponding electrical traces on the circuit board when the one or more force are applied between the space transformer and the circuit board. Thus, the deformable connector may couple the space transformer to the circuit board under the application of one or more external forces, and may decouple the space transformer from the circuit board in the absence of any external forces. This enables the probe card interface to be quickly and easily "attached" to (and "detached" from) the circuit board, without relying on a soldering (or desoldering) process. Among other advantages, aspects of the present disclosure provide for a probe card assembly having interchangeable and/or replaceable parts.

Figure 1:
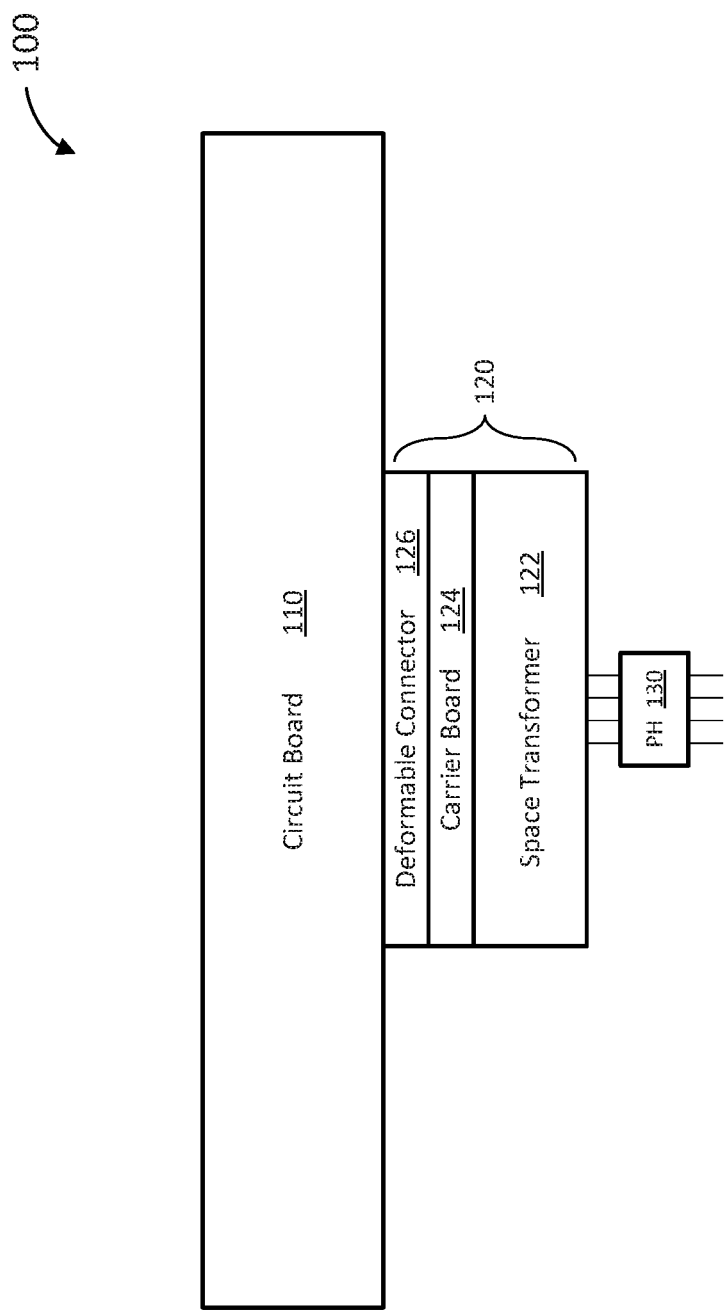
FIG. 1 illustrates a probe card assembly, in accordance with some embodiments.

FIG. 1 illustrates a probe card assembly 100, in accordance with some embodiments. The probe card assembly 100 (hereinafter referred to as a "probe card") includes a circuit board 110, a detachable probe card interface 120, and a probe head 130. The circuit board 110 may be a printed circuit board (PCB) with a number of electrical contacts or traces disposed thereon. When the probe card 100 is used in the testing of an IC device, a testing apparatus (e.g., automatic test equipment or "ATE") is connected to one or more electrical traces on the circuit board 110 to communicate data signals and/or power/ground to a device under test (DUT). The probe head 130 includes a number of pins designed to make electrical contact with one or more contact pads of the DUT (not shown for simplicity). The detachable probe card interface 120 interfaces (e.g., couples) the probe head 130 with the circuit board 110 and facilitates the transmission of data signals and/or power/ground between the testing apparatus and the DUT. For example, one or more of the pins in the probe head 130 may correspond to conductive wires that are electrically connected to the traces on the circuit board 110.

The DUT is typically much smaller than the circuit board 110. Accordingly, the "pitch" of (e.g., space between) the pins of the probe head 130 may be much smaller or finer than the pitch of the traces on the circuit board 110. The detachable probe card interface 120 may be configured to "spread out" the transmission paths (e.g., conductors) from the probe head 130 so that they align properly with the traces on the circuit board 110. In some embodiments, the detachable probe card interface 120 may include a space transformer 122, a carrier board 124, and a deformable connector 126. The space transformer 122 may be configured to bridge the gap between the arrangement of pins in the probe head 130 and the arrangement of electrical traces on the circuit board 110. For example, the space transformer 122 may include a set of first contact elements (e.g., on a first surface of the space transformer 122) that are aligned with the pins of the probe head 130 and a set of second contact elements (e.g., on a second surface of the space transformer 122) that are aligned with the electrical traces on the circuit board 110. The space transformer 122 may comprise a multi-layer structure (e.g., MLO, MLC, or multiple layers of substrate). The first contact elements may be coupled to the second contact elements through one or more layers of the space transformer 122.

The carrier board 124 is disposed between the space transformer 122 and the deformable connector 126. In some embodiments, the carrier board 124 may be soldered to the space transformer 122 to provide structural support for (e.g., add to the rigidity of) the space transformer 122. For example, the carrier board 124 may comprise a layer of ceramic material. In some embodiments, the carrier board 124 includes a plurality of conductors that are configured to establish respective transmission paths between the space transformer 122 and the deformable connector 126. For example, one end of the conductors may be coupled to the second electrical contacts on the space transformer 122 and the other end of the conductors may extend, at least in part, into the deformable connector 126. As described in greater detail below, the carrier board 124 may provide a stable and secure electrical connection between the second electrical contacts and a plurality of conductive particles in the deformable connector 126.

In some embodiments, the deformable connector 126 may be configured to electrically couple the detachable probe card interface 120 to the circuit board 110 in a solderless manner. For example, the deformable connector 126 may include a plurality of conductive particles bounded by an elastic shield or housing. The elastic shield may be configured to deform or compress when one or more forces are applied across the deformable connector 126. In some aspects, the forces may be exerted by mechanisms (such as screws, hooks, latches, and the like) used to mechanically couple the detachable probe card interface 120 to the circuit board 110. The compression of the deformable connector 126 may cause the conductive particles to compress against one another, thereby creating a stable and secure electrical connection between the carrier board 124 and the circuit board 110. Thus, the detachable probe card interface 120 may be coupled to the circuit board 110 under the application of one or more external forces, and may be decouple from the circuit board 110 in the absence of such external forces.

Figure 2:
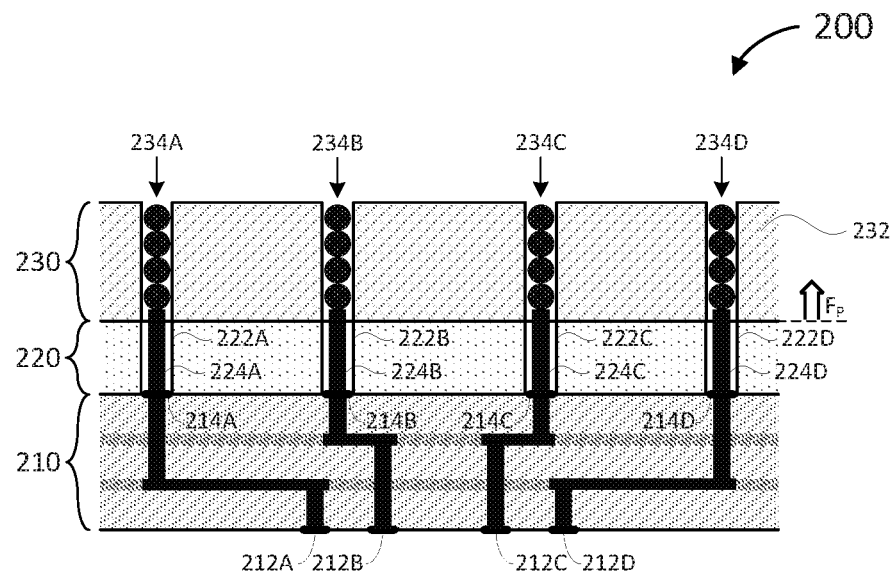
FIG. 2 shows a cross-sectional view of a detachable probe card interface, in accordance with some embodiments.

FIG. 2 shows a cross-sectional view of a detachable probe card interface 200, in accordance with some other embodiments. For example, the detachable probe card interface 200 may be an embodiment of the detachable probe card interface 120 of FIG. 1. The detachable probe card interface 200 may include a space transformer 210, a carrier board 220, and a deformable connector 230. With reference for example to FIG. 1, the space transformer 210 may be an embodiment of the space transformer 122, the carrier board 220 may be an embodiment of the carrier board 124, and the deformable connector 230 may be an embodiment of the deformable connector 126.

The space transformer 210 includes a set of first contact elements 212A-212D disposed on a bottom surface of the space transformer 210 (e.g., facing away from the carrier board 220). The space transformer 210 further includes a set of second contact elements 214A-214D disposed on a top surface of the space transformer 210 (e.g., facing the carrier board 220). In the example of FIG. 2, only four contact elements are shown on either side of the space transformer 210. However, in actual implementations, the space transformer 210 may include fewer or more contact elements, in various other configurations, than what is depicted in FIG. 2. As shown in FIG. 2, the pitch of the first contact elements 212A-212D may be smaller or finer than the pitch of the second contact elements 214A-214D. Thus, the first contact elements 212A-212D may be configured to interface with (e.g., couple to) the pins of a probe head (such as probe head 130), and the second contact elements 214A-214D may be configured to interface with the electrical traces on a circuit board (such as circuit board 110).

In some embodiments, each of the first contact elements 212A-212D is coupled to a respective one of the second contact elements 214A-214D. In the example of FIG. 2, the first contact element 212A furthest to the left on the bottom surface is coupled to the second contact element 214A furthest to the left on the top surface, the first contact element 212B left of center on the bottom surface is coupled to the second contact element 214B left of center on the top surface, the first contact element 212C right of center on the bottom surface is coupled to the second contact element 214C right of center on the top surface, and the first contact element 212D furthest to the right on the bottom surface is coupled to the second contact element 214D furthest to the right on the top surface. In some embodiments, the space transformer 210 may be comprise a multi-layer structure (e.g., MLO, MLC, or multiple layers of substrate). Accordingly, the first contact elements 212A-212D may be coupled to the second contact elements 214A-214D, respectively, via conductive traces formed on one or more layers of the space transformer 210.

The carrier board 220 includes a number of vias (e.g., holes) 222A-222D extending from a top surface of the carrier board 220 (e.g., facing the deformable connector 230) to a bottom surface of the carrier board 220 (e.g., facing the space transformer 210). In some embodiments, the carrier board 220 may be soldered to the space transformer 210 to provide structural support for (e.g., adding to the rigidity of) the space transformer 210. For example, the carrier board 220 may comprise a layer of ceramic material. In the example of FIG. 2, only four vias 222A-222D are shown in the carrier board 220. However, in actual implementations, the carrier board 220 may include fewer or more vias, in various other configurations, than what is depicted in FIG. 2. The vias 222A-222D are aligned with the second contact elements 214A-214D, respectively, of the space transformer 210. A number of conductors 224A-224D are disposed in the vias 222A-222D, respectively. For example, each of the conductors 224A-224D may be affixed within a corresponding via using an adhesive (such as epoxy). In some embodiments, each of the conductors 224A-224D may protrude beyond the top surface of the carrier board 220, extending at least partially into the deformable connector 230. More specifically, each of the conductors 224A-224D may press against (e.g., exert a force on) one or more columns of conductive particles of the deformable connector 230.

In some embodiments, each of the conductors 224A-224D may be coupled to a respective one of the second contact elements 214A-214B on the space transformer 210. For example, each of the conductors 224A-224D may be soldered to a corresponding second contact element. In the example of FIG. 2, the conductor 224A furthest to the left on the carrier board 220 is coupled to the second contact element 214A furthest to the left on the space transformer 210, the conductor 224B left of center on the carrier board 220 is coupled to the second contact element 214B left of center on the space transformer 210, the conductor 224C right of center on the carrier board 220 is coupled to the second contact element 214C right of center on the space transformer 210, and the conductor 224D furthest to the right on the carrier board 220 is coupled to the second contact element 214D furthest to the right on the space transformer 210. Thus, while the carrier board may prevent the space transformer 210 from bending or flexing (e.g., when one or more external forces are applied across the detachable probe card interface 200), the conductors 224A-224D create transmission paths along the cross-section of the carrier board 220 (e.g., bridging the divide between the space transformer 210 and the deformable connector 230).

The deformable connector 230 includes a plurality of conductive particles 234 bounded by an elastic shield 232. For example, the deformable connector 230 may comprise a layer of elastomer. In some embodiments, the conductive particles may be arranged in columns 234A-234D extending from a top surface of the deformable connector 230 (e.g., facing away from the carrier board 220) to a bottom surface of the deformable connector 230 (e.g., facing the carrier board 220). In the example of FIG. 2, only four columns of conductive particles are shown in the deformable connector 230. However, in actual implementations, the deformable connector 230 may include fewer or more columns of conductive particles, in various other configurations, than what is depicted in FIG. 2. It is noted that, in some embodiments, the number of columns of conductive particles in the deformable connector 230 may be greater than the number of conductors in the carrier board 220 (e.g., and the number of second contact elements 214A-214D on the space transformer 210). The elastic shield 232 may insulate each of the columns of conductive particles 234A-234D from one another. In some embodiments, the elastic shield 232 may be configured to deform or compress (e.g., by stretching laterally) when one or more forces are applied across the top and bottom surface of the deformable connector 230. For example, the elastic shield 232 may be formed from a flexible material such as silicon.

In some embodiments, each column of conductive particles 234A-234D may substantially coincide with one of the conductors 224A-224D of the carrier board 220. In the example of FIG. 2, the column of conductive particles 234A furthest to the left on the deformable connector 230 is aligned with the conductor 224A furthest to the left on the carrier board 220, the column of conductive particles 234B left of center on the deformable connector 230 is aligned with the conductor 224B left of center on the deformable connector 230, the column of conductive particles 234C right of center on the deformable connector 230 is aligned with the conductor 224C right of center on the deformable connector 230, and the column of conductive particles 234D furthest to the right on the deformable connector 230 is aligned with the conductor 224D furthest to the right on the deformable connector 230. Thus, when the deformable connector 230 is in a compressed state, the columns of conductive particles 234A-234D may be electrically coupled to the conductors 224A-224D, respectively, thereby establishing respective transmission paths along the cross-section of the detachable probe card interface 200 (e.g., from the first contact elements 212A-212D to the columns of conductive particles 234A-234D, respectively).

As described above, each of the conductors 224A-224D protrudes, at least in part, into the deformable connector 230. This protrusion may exert a pre-loaded amount of force ($F_P$) on the conductive particles (e.g., depending on the length of protrusion), thereby ensuring a secure and stable electrical connection across the columns of conductive particles 234A-234D. In the example of FIG. 2, each conductor 224A-224D is shown to exert a pre-loaded amount of force on a respective one of the columns of conductive particles 234A-234D. However, in some embodiments, each of the conductors 224A-224D may coincide with one or more columns of conductive particles in the deformable connector 230 (e.g., depending on the number and/or pitch of the columns in the deformable connector 230). Thus, in actual implementations, each of the conductors 224A-224D may exert a pre-loaded amount of force on one or more columns of conductive particles in the deformable connector 230.

Figure 3:
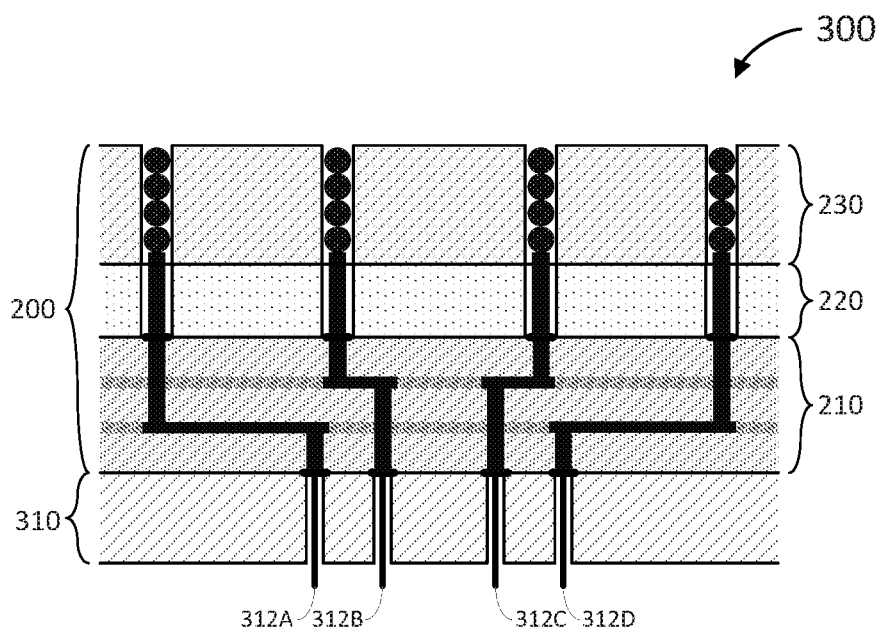
FIG. 3 shows a cross-sectional view of a detachable probe head assembly, in accordance with some embodiments.

FIG. 3 shows a cross-sectional view of a detachable probe head assembly 300, in accordance with some embodiments. The detachable probe head assembly 300 may include a probe head 310 and the detachable probe card interface 200 of FIG. 2. As described above, the detachable probe card interface 200 may include space transformer 210, carrier board 220, and deformable connector 230. The detachable probe card interface 200 may be configured to interface the probe head 310 with a circuit board (not shown for simplicity). For example, the probe head 310 may be an embodiment of the probe head 130 of FIG. 1.

The probe head 310 is coupled to the bottom surface of the space transformer 210, and includes a number of signal pins 312A-312D. The signal pins 312A-312D may be configured to transmit signals to and/or receive signals from a DUT (not shown for simplicity). For example, each of the signal pins 312A-312D may be brought into contact with a corresponding contact pad of the DUT. In the example of FIG. 3, only four signal pins are shown in the probe head 310. However, in actual implementations, the probe head 310 may include fewer or more signal pins, in various other configurations, than what is depicted in FIG. 3. It is noted that the pitch of the signal pins 312A-312D is relatively small. Therefore, the detachable probe card interface 200 (e.g., including the space transformer 210 and the deformable connector 230) may be used to spread out the transmission paths originating from the signal pins 312A-312D to properly interface with larger devices (such as a circuit board).

In some embodiments, each of the signal pins 312A-312D is coupled to a respective one the first contact elements 212A-212D on the space transformer 210. In the example of FIG. 3, the signal pin 312A furthest to the left on the probe head 310 is coupled to the first contact element 212A furthest to the left on the space transformer 210, the signal pin 312B left of center on the probe head 310 is coupled to the first contact element 212B left of center on the space transformer 210, the signal pin 312C right of center on the probe head 310 is coupled to the first contact element 212C right of center on the space transformer 210, and the signal pin 312D furthest to the right on the probe head 310 is coupled to the first contact element 212D furthest to the right on the space transformer 210. Thus, when the deformable connector 230 is in a compressed state, the columns of conductive particles 234A-234D may be electrically coupled to the second contact elements 214A-214D, thereby establishing a plurality of transmission paths (e.g., electrical connections) along the cross-section of the detachable probe assembly 300 (e.g., from the signal pins 312A-312D to the columns of conductive particles 234A-234D, respectively).

Figure 4A:
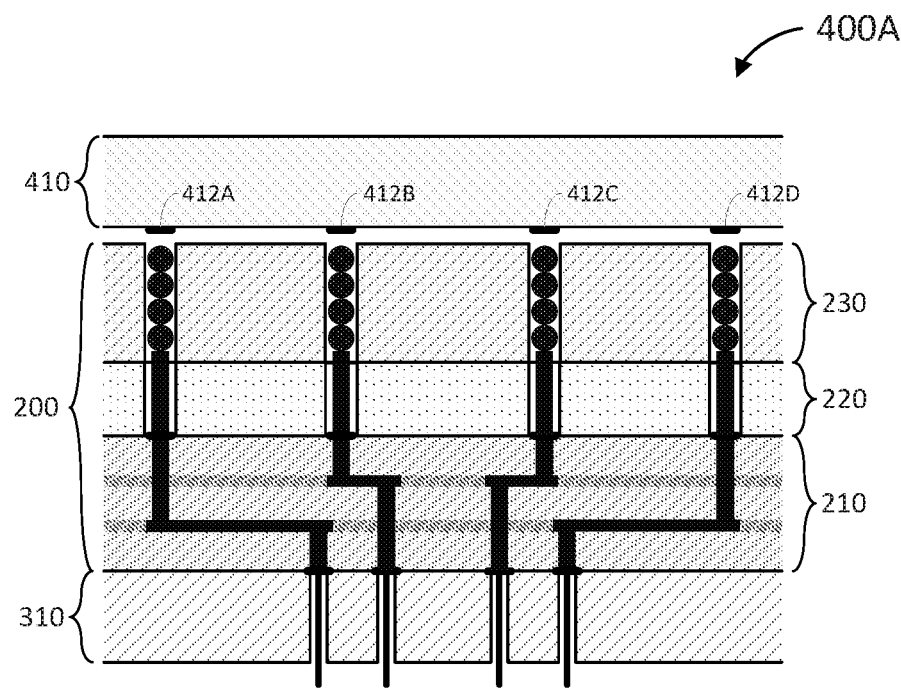
FIG. 4A shows a cross-sectional view of an example probe card assembly in a detached configuration.

FIG. 4A shows a cross-sectional view of an example probe card assembly 400A in a detached configuration. The probe card assembly 400A may include a circuit board 410, the probe head 310 of FIG. 3, and the detachable probe card interface 200 of FIG. 2. As described above, the detachable probe card interface 200 may include space transformer 210, carrier board 220, and deformable connector 230. The detachable probe card interface 200 may be configured to interface the probe head 310 with the circuit board 410. For example, the circuit board 410 may be an embodiment of the circuit board 110 of FIG. 1.

The circuit board 410 includes a number of electrical traces 412A-412D. The electrical traces 412A-412D may be configured to transmit signals to and/or receive signals from a testing apparatus (not shown for simplicity). For example, a testing apparatus (e.g., ATE) may be connected to the circuit board 410 via the electrical traces 412A-412D to communicate data signals and/or supply power to a DUT. In the example of FIG. 4A, only four electrical traces are shown on the circuit board 410. However, in actual implementations, the circuit board 410 may include fewer or more electrical traces, in various other configurations, than what is depicted in FIG. 4A. It is noted that the pitch of the electrical traces 412A-412D is relatively large (e.g., compared to the pitch of the signal pins 312A-312D of the probe head 310). Therefore, the detachable probe card interface 200 may be used to spread out the transmission paths originating from the signal pins 312A-312D to properly interface and/or align with the electrical traces 412A-412D on the circuit board 410.

In some embodiments, each of the electrical traces 412A-412D may be substantially aligned with one or more columns of conductive particles in the deformable connector 230. In the example of FIG. 4A, the electrical trace 412A furthest to the left on the circuit board 410 is aligned with the column of conductive particles 234A furthest to the left on the deformable connector 230, the electrical trace 412B left of center on the circuit board 410 is aligned with the column of conductive particles 234B left of center on the deformable connector 230, the electrical trace 412C right of center on the circuit board 410 is aligned with the column of conductive particles 234C right of center on the deformable connector 230, and the electrical trace 412D furthest to the right on the circuit board 410 is aligned with the column of conductive particles 234C furthest to the right on the deformable connector 230. As described in greater detail below, with respect to FIG. 4B, when the circuit board 410 is attached and/or coupled to the detachable probe card interface 200, the deformable connector 230 may establish a number of transmission paths from the signal pins 312A-312D to the electrical traces 412A-412D, respectively.

In the example of FIG. 4A, the circuit board 410 is detached (e.g., electrically decoupled) from the probe card interface 200 (and the probe head 310). In some embodiments, the circuit board 410 may be attached to the probe card interface 200 in a solderless manner. For example, the columns of conductive particles 234A-234D may be coupled to the electrical traces 412A-412D on the circuit board 410 by applying force or pressure between the circuit board 410 and the probe card interface 200. In some aspects, the forces may be exerted by one or more mechanisms (not shown for simplicity) used to mechanically couple the probe card interface 200 to the circuit board 410 (e.g., screws, hooks, latches, and the like).

Figure 4B:
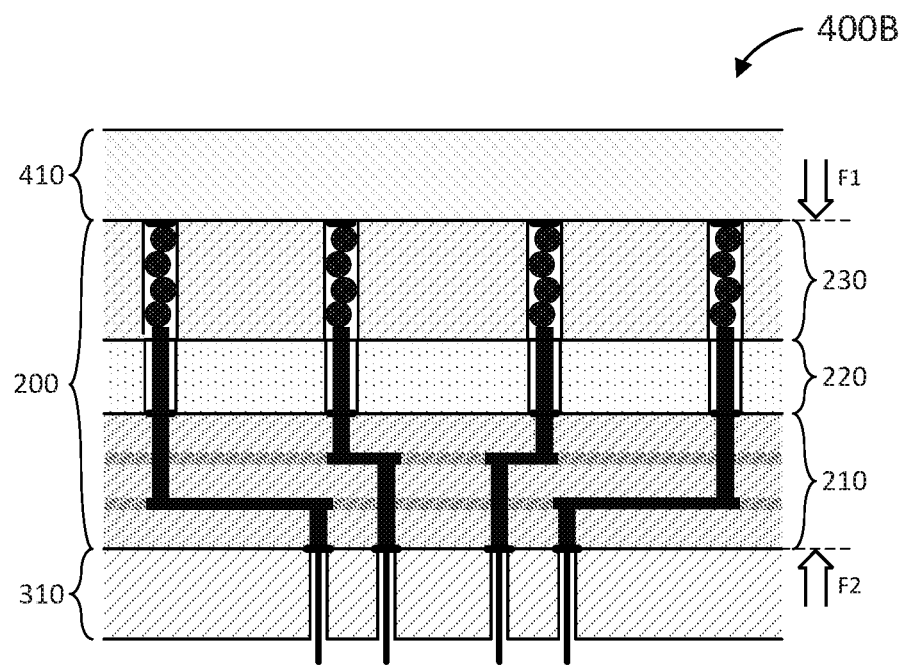
FIG. 4B shows a cross-sectional view of an example probe card assembly in an attached configuration.

FIG. 4B shows a cross-sectional view of an example probe card assembly 400B in an attached configuration. In the example of FIG. 4B, the circuit board 410 is attached and/or coupled to the probe card interface 200 (e.g., and the probe head 310) by a force (F1) exerted on a top surface of the detachable probe card interface 200 (e.g., the top surface of the deformable connector 230) and a force (F2) exerted on a bottom surface of the probe card interface 200 (e.g., the bottom surface of the space transformer 210). In some embodiments, the detachable probe card interface 200 and/or probe head 310 may be affixed to the circuit board 410 using screws (e.g., mounted to a stiffening layer of the circuit board 410). In some aspects, the forces F1 and F2 may be exerted, at least in part, by the tension in the screws holding the probe card interface 200 and/or probe head 310 to the circuit board 410. In some other aspects, the forces F1 and F2 may be exerted, at least in part, by the conductors 224A-224D of the carrier board 220 protruding into the deformable connector 230. For example, the conductors 224A-224D may exert a pre-loaded amount of force ($F_P$) on the columns of conductive particles 234A-234D. Among other advantages, aspects of the present disclosure enable the probe card interface 200 to be electrically coupled to the circuit board 410 without soldering any of the electrical traces 412A-412D to the probe card interface 200.

In some embodiments, the forces F1 and F2 exerted across the detachable probe card interface 200 cause the deformable connector 230 to deform and/or compress. In some aspects, the compression of the elastic shield 232 causes the conductive particles 234A-234D to press against and/or compress with one another, thereby creating a stable and secure electrical connection across each column of conductive particles 234A-234D. Furthermore, the protrusion of the conductors 224A-224D into the deformable connector 230 may add to the force compressing the conductive particles 234A-234D. The additional force exerted by the conductors 224A-224D may further strengthen the electrical connections across the columns of conductive particles 234A-234D and/or reduce the amount of external force needed to establish a secure electrical connection. Thus, while the deformable connector 230 is in the compressed state, the columns of conductive particles 234A-234D may electrically couple the second contact elements 214A-214D of the space transformer 210 to respective electrical traces 412A-412D on the circuit board 410, thereby establishing respective transmission paths along the cross-section of the probe card assembly 400B (e.g., from the signal pins 312A-312D to the electrical traces 412A-412D, respectively). In some embodiments, the carrier board 220 may provide increased structural rigidity for the space transformer 210, thereby preventing the space transformer 210 from bending or flexing under the pressure of the forces F1 and F2.

In some embodiments, the detachable probe card interface 200 may be detached and decoupled from the circuit board 410 by releasing the forces F1 and F2 exerted on the detachable probe card interface 200. In some aspects, the detachable probe card interface 200 may be detached from the circuit board 410 by unscrewing the probe card interface 200 from the circuit board 410. Releasing the forces F1 and F2 exerted across the detachable probe card interface 200 may return the probe card assembly to a detached state (such as shown in FIG. 4A). Among other advantages, aspects of the present disclosure enable the detachable probe card interface 200 to be electrically decoupled from the circuit board 410 without desoldering any of the electrical traces 412A-412D from the probe card interface 200.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A probe card interface, comprising:
a space transformer including a plurality of first electrical contacts and a plurality of second electrical contacts, wherein the first electrical contacts are coupled to the second electrical contacts through one or more layers of the space transformer;
a deformable connector including a plurality of conductive particles arranged in columns coinciding with the plurality of second electrical contacts, wherein the conductive particles are configured to compress with one another when one or more forces are exerted on the deformable connector; and
a carrier board, disposed between the space transformer and the deformable connector, to add rigidity to the space transformer and prevent the space transformer from bending under external forces, the carrier board including:
a plurality of vias aligned with the plurality of second electrical contacts on the space transformer; and
a plurality of conductors disposed within the vias, wherein each of the conductors is coupled to a respective one of the second electrical contacts and protrudes into the deformable connector to establish a transmission path between the second electrical contact and one or more columns of the conductive particles.

2. The probe card interface of claim 1, wherein the deformable connector further comprises:
an elastic shield disposed around each column of the conductive particles, wherein the elastic shield is configured to deform when the one or more forces are exerted on the deformable connector.

3. The probe card interface of claim 1, wherein the columns of conductive particles are configured to establish a transmission path along a cross-section of the deformable connector when the one or more forces are exerted on the deformable connector.

4. The probe card interface of claim 1, wherein the one or more forces are provided, at least in part, by the plurality of conductors protruding into the deformable connector.

5. The probe card interface of claim 1, wherein the carrier board comprises a layer of ceramic material to provide structural support for the space transformer.

6. A probe head assembly, comprising:
a probe head including a plurality of pins;
a space transformer including a plurality of first electrical contacts and a plurality of second electrical contacts, wherein the first electrical contacts are coupled to the second electrical contacts through one or more layers of the space transformer;
a deformable connector including a plurality of conductive particles arranged in columns coinciding with the plurality of second electrical contacts, wherein the conductive particles are configured to compress with one another when one or more forces are exerted on the deformable connector; and
a carrier board, disposed between the space transformer and the deformable connector, to add rigidity to the space transformer and prevent the space transformer from bending under external forces, the carrier board including:
a plurality of vias aligned with the plurality of second electrical contacts on the space transformer; and
a plurality of conductors disposed within the vias, wherein each of the conductors is coupled to a respective one of the second electrical contacts and protrudes into the deformable connector to establish a transmission path between the second electrical contact and one or more columns of the conductive particles.

7. The probe head assembly of claim 6, wherein the deformable connector further comprises:
an elastic shield disposed around each column of the conductive particles, wherein the elastic shield is configured to deform when the one or more forces are exerted on the deformable connector.

8. The probe head assembly of claim 6, wherein the columns of conductive particles are configured to establish a transmission path along a cross-section of the deformable connector when the one or more forces are exerted on the deformable connector.

9. The probe head assembly of claim 6, wherein the one or more forces are provided, at least in part, by the plurality of conductors protruding into the deformable connector.

10. The probe head assembly of claim 6, wherein the carrier board comprises a layer of ceramic material to provide structural support for the space transformer.

11. The probe head assembly of claim 6, wherein the first electrical contacts on the space transformer are aligned with the plurality of pins in the probe head.

12. A probe card, comprising:
a first circuit including a plurality of electrical traces;
a probe head including a plurality of pins;
a space transformer including a plurality of first electrical contacts and a plurality of second electrical contacts, wherein the first electrical contacts are coupled to the second electrical contacts through one or more layers of the space transformer;
a deformable connector including a plurality of conductive particles arranged in columns coinciding with the plurality of second electrical contacts, wherein the conductive particles are configured to compress with one another when one or more forces are exerted on the deformable connector; and
a carrier board, disposed between the space transformer and the deformable connector, to add rigidity to the space transformer and prevent the space transformer from bending under external forces, the carrier board including:
a plurality of vias aligned with the plurality of second electrical contacts on the space transformer; and
a plurality of conductors disposed within the vias, wherein each of the conductors is coupled to a respective one of the second electrical contacts and protrudes into the deformable connector to establish a transmission path between the second electrical contact and one or more columns of the conductive particles.

13. The probe card of claim 12, wherein the deformable connector further comprises:
an elastic shield disposed around each column of the conductive particles, wherein the elastic shield is configured to deform when the one or more forces are exerted on the deformable connector.

14. The probe card of claim 12, wherein the columns of conductive particles are configured to establish a transmission path along a cross-section of the deformable connector when the one or more forces are exerted on the deformable connector.

15. The probe card of claim 12, wherein the one or more forces are provided, at least in part, by the plurality of conductors protruding into the deformable connector.

16. The probe card of claim 12, wherein the carrier board comprises a layer of ceramic material to provide structural support for the space transformer.

17. The probe card of claim 12, wherein the first electrical contacts on the space transformer are aligned with the plurality of pins in the probe head of the probe card.

18. The probe card of claim 12, wherein the first electrical contacts on the space transformer are aligned with the plurality of pins in the probe head, and wherein the second electrical contacts on the space transformer are aligned with the electrical traces on the first circuit.

19. The probe card of claim 12, wherein an electrical connection is established between each of the plurality of pins and a respective one of the plurality of electrical traces when the one or more forces are exerted on the deformable connector.

20. The probe card of claim 12, wherein the one or more forces are provided, at least in part, by one or more mechanisms used to mechanically couple the probe head to the first circuit.

* * * * *